United States Patent
Boerstler et al.

(10) Patent No.: US 7,904,264 B2
(45) Date of Patent: Mar. 8, 2011

(54) ABSOLUTE DUTY CYCLE MEASUREMENT

(75) Inventors: David W. Boerstler, Round Rock, TX (US); Eskinder Hailu, Austin, TX (US); Masaaki Kaneko, Round Rock, TX (US); Jieming Qi, Austin, TX (US); Bin Wan, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 294 days.

(21) Appl. No.: 11/938,456

(22) Filed: Nov. 12, 2007

(65) Prior Publication Data
US 2009/0125262 A1 May 14, 2009

(51) Int. Cl.
*G01R 35/00* (2006.01)
*G01R 15/00* (2006.01)

(52) U.S. Cl. ............... 702/79; 702/57; 702/85; 702/89; 327/175; 327/176

(58) Field of Classification Search .................. 702/57, 702/66, 71, 74, 79, 85, 89; 327/172–175
See application file for complete search history.

(56) References Cited

U.S. PATENT DOCUMENTS

| | | |
|---|---|---|
| 4,552,118 A | 11/1985 | Fukaya |
| 4,675,597 A | 6/1987 | Hernandez |
| 4,814,872 A | 3/1989 | Ivie |
| 4,859,944 A | 8/1989 | Webb |
| 4,962,431 A | 10/1990 | Imakawa et al. |
| 5,367,200 A | 11/1994 | Leonida |
| 5,789,723 A | 8/1998 | Hirst |
| 5,933,399 A | 8/1999 | Kim |
| 5,987,238 A | 11/1999 | Chen |
| 6,060,922 A | 5/2000 | Chow et al. |
| 6,084,452 A | 7/2000 | Drost et al. |
| 6,150,847 A | 11/2000 | Lu |
| 6,240,526 B1 | 5/2001 | Petivan et al. |

(Continued)

FOREIGN PATENT DOCUMENTS

EP 0957605 A2 11/1999

OTHER PUBLICATIONS

U.S. Appl. No. 11/383,570, filed May 16, 2006, Boerstler et al.

(Continued)

*Primary Examiner* — Andrew Schechter
*Assistant Examiner* — Phuong Huynh
(74) *Attorney, Agent, or Firm* — Stephen R. Tkacs; Stephen J. Walder, Jr.; Matthew B. Talpis (57) ABSTRACT

A mechanism for measuring the absolute duty cycle of a signal is provided. A non-inverted path from a signal source is selected and various DCC circuit setting indices are cycled through until a divider, coupled to the output of the DCC circuit, fails. A first minimum pulse width at which the divider fails is then determined based on the index value of the DCC circuit at the time of the failure. An inverted path from the signal source is selected and the various DCC circuit setting indices are cycled through again until the divider fails. A second minimum pulse width at which the divider fails is then determined based on the index value of the DCC circuit at the time of this second failure. The duty cycle is then calculated based on a difference of the first and second minimum pulse width values.

20 Claims, 6 Drawing Sheets

U.S. PATENT DOCUMENTS

| | | |
|---|---|---|
| 6,260,176 B1 | 7/2001 | Chen |
| 6,664,834 B2 | 12/2003 | Nair et al. |
| 6,700,530 B1 | 3/2004 | Nilsson |
| 6,798,266 B1 | 9/2004 | Vu et al. |
| 6,809,678 B2 | 10/2004 | Vera et al. |
| 6,842,399 B2 | 1/2005 | Harrison |
| 6,847,244 B2 | 1/2005 | Pillay et al. |
| 6,961,403 B1 | 11/2005 | Austin et al. |
| 7,002,358 B2 | 2/2006 | Wyatt |
| 7,042,257 B2 | 5/2006 | Wang |
| 7,058,120 B1 | 6/2006 | Lu et al. |
| 7,227,809 B2 | 6/2007 | Kwak |
| 7,350,095 B2 | 3/2008 | Boerstler et al. |
| 7,369,001 B2 | 5/2008 | Yu |
| 7,551,463 B2 | 6/2009 | Ros et al. |
| 7,617,059 B2 | 11/2009 | Boerstler et al. |
| 7,816,900 B2 | 10/2010 | Brown |
| 2002/0097035 A1 | 7/2002 | Atallah et al. |
| 2004/0183578 A1* | 9/2004 | Chong et al. ............ 327/161 |
| 2005/0225314 A1 | 10/2005 | Belleau |
| 2006/0103367 A1* | 5/2006 | Boerstler et al. ......... 324/76.47 |
| 2006/0103441 A1* | 5/2006 | Carpenter et al. ......... 327/175 |
| 2006/0212739 A1* | 9/2006 | Boerstler et al. ............ 713/500 |
| 2008/0111604 A1 | 5/2008 | Boerstler et al. |
| 2008/0229270 A1 | 9/2008 | Boerstler et al. |
| 2009/0007047 A1 | 1/2009 | Boerstler et al. |
| 2009/0021314 A1 | 1/2009 | Boerstler et al. |
| 2009/0128206 A1 | 5/2009 | Boerstler et al. |
| 2009/0132971 A1 | 5/2009 | Boerstler et al. |
| 2009/0138834 A1 | 5/2009 | Boerstler et al. |
| 2009/0183136 A1 | 7/2009 | Boerstler et al. |
| 2010/0199237 A1 | 8/2010 | Kim et al. |

OTHER PUBLICATIONS

U.S. Appl. No. 11/555,018, filed Oct. 31, 2006, Boerstler et al.
U.S. Appl. No. 11/380,982, filed May 1, 2006, Boerstler et al.
U.S. Appl. No. 11/381,031, filed May 1, 2006, Boerstler et al.
U.S. Appl. No. 11/381,050, filed May 1, 2006, Boerstler et al.
"Charge Pumps Shine in Portable Designs", Dallas Semiconductor, Maxim Application Note 669, (Mar. 15, 2001), www.maxim-ic.com/an669, 15 pages.
Tsang et al., "Picosecond imaging circuit analysis", IBM Corporation, IBM JRD, vol. 44, No. 4, (Jul. 4, 2000), pp. 583-603.
Bhatti et al., "Duty Cycle Measurement and Correction Using a Random Sampling Technique", Proceedings of the 48th IEEE Int'l. Midwest Symposium on Circuits & Systems, (Aug. 2005), 4 pages.
"Cell Broadband Engine Architecture", IBM Corporation, Ver. 1.0, (Aug. 8, 2005), 67 pages.
Matano et al., "A 1-Gb/s/pin 512-Mb DDRII SDRAM using a digital DLL and a slew-rate-controlled output buffer", downloaded from www.elpida.com on Mar. 13, 2006, 2 pages.
Nam et al., "An All-Digital CMOS Duty Cycle Correction Circuit with a Duty-Cycle Correction Range of 15-to-85% for Multi-Phase Applications", IEICE Trans. Electron., vol. E88-C, No. 4, (Apr. 2005), pp. 773-777.
Page, M., "IBM's Cell Processor: Preview to Greatness?", (May 15, 2005), 6 pages.
Travis et al., "Circuit conditions variable-duty-cycle clock", EDN Access, (Feb. 17, 1997), http://www.edn.com/archives/1997/021797/04DI_OI.htm, 2 pages.

* cited by examiner

ABSOLUTE DUTY CYCLE MEASUREMENT

BACKGROUND

1. Technical Field

The present application relates generally to an improved duty cycle measurement apparatus and method. More specifically, the present application is directed to an inexpensive absolute duty cycle measurement method and apparatus which does not require large additional hardware, is amendable to large throughput, and is useful for applications in manufacturing environments.

2. Description of Related Art

Conventional clock signal generator circuits allow the designer to vary the duty cycle of a clock signal that the circuit produces. During a clock period, a clock signal exhibits a logic high for a portion of the period and a logic low for the remainder of the period. Duty cycle refers to the percentage of a clock period that the clock signal exhibits a particular logic state (e.g., a logic high state). A signal that exhibits a logic high state for 50% of the signal period corresponds to a 50% duty cycle. Similarly, a signal that exhibits a logic high state for 40% of a signal period corresponds to a 40% duty cycle. Of course, the designer may alternatively employ inverted logic and define the duty cycle in terms of the percentage of a signal period that the signal exhibits a logic low state.

At relatively low frequencies up to and including the MHz range, it is not difficult to measure incremental changes or adjustments to the duty cycle of a digital signal. However, when dealing with clock circuits in the GHz range, the designer experiences significantly more difficulty in measuring small changes in the duty cycle of a digital signal. In terms of time instead of frequency, incremental adjustments to the clock duty cycle or pulse duration in the picosecond range are very difficult to measure.

One solution for measuring changes to the duty cycle of a clock signal in the picosecond range is a high speed oscilloscope with very large bandwidth. Unfortunately, a laboratory setup with a multi-GHz scope is expensive to implement and maintain. Moreover, care must be taken to assure that whatever circuitry couples the clock signal from a logic chip to the scope does not introduce jitter exceeding the duration of the incremental adjustment to the duty cycle.

Another approach to measuring changes to the duty cycle of a clock signal on an integrated circuit (IC) is picosecond imaging circuit analysis (PICA). The PICA method detects photons of light emitted on the leading and trailing edges of clock pulses to determine their duty cycle. While this type of duty cycle analysis works well, it is extremely expensive to implement. Moreover, this type of analysis destroys the component under test.

The most popular way to extract absolute duty cycle is by driving the signal through a low pass filter. The output of the low pass filter will have a value that is representative of the duty cycle of the input signal. However, implementation of the low pass filter requires a large resistor and capacitor. This adds to the overall chip size.

SUMMARY

In one illustrative embodiment, a method for determining a duty cycle of an input signal is provided. The method may comprise receiving the input signal in a correction circuit which generates an output to a divider circuit coupled to the correction circuit based on the input signal, determining a setting of the correction circuit at which the divider circuit fails, and calculating a duty cycle of the input signal based on the setting of the correction circuit at which the divider circuit fails. Determining a setting of the correction circuit at which the divider circuit fails may comprise cycling through one or more correction settings of the correction circuit, monitoring an output of the divider circuit to determine, for the one or more correction settings of the correction circuit, if the divider circuit fails, and identifying a first setting of the correction circuit at which the output of the divider circuit identifies the divider circuit as having failed.

Determining a setting of the correction circuit at which the divider circuit fails may comprise cycling through one or more of correction settings of the correction circuit until a first failure of the divider circuit is detected, determining a first pulse width based on a first correction setting at a point of the first failure of the divider circuit, and generating an inverted form of the input signal. Determining a setting of the correction circuit at which the divider circuit fails may further comprise providing the inverted form of the input signal to the correction circuit, cycling through the one or more correction settings of the correction circuit until a second failure of the divider circuit is detected, determining a second pulse width based on a second correction setting at a point of the second failure of the divider circuit, and determining a duty cycle of the signal based on a relationship of the first pulse width and the second pulse width. Calculating the duty cycle of the input signal may comprise calculating the duty cycle using the following equation:

$$DC=\frac{1}{2}-[(i_{path2}*(\text{delta})-i_{path1}*(\text{delta}))]/2T]$$

where DC is the duty cycle, $i_{path1}$ is an index of the first correction setting index, $i_{path2}$ is an index of the second correction setting, delta is a minimum correction amount of the correction circuit, and T is a period of the input signal.

In another illustrative embodiment, an apparatus for determining a duty cycle of an input signal is provided. The apparatus may comprise a correction circuit, a divider circuit coupled to the correction circuit, and a measurement device coupled to the divider circuit. The correction circuit may receive the input signal and may generate an output signal to the divider circuit based on the input signal. The measurement device may determine a setting of the correction circuit at which the divider circuit fails and may calculate a duty cycle of the input signal based on the setting of the correction circuit at which the divider circuit fails.

The measurement device may determine a setting of the correction circuit at which the divider circuit fails by sending control signals to the correction circuit to cycle through one or more correction settings of the correction circuit until a first failure of the divider circuit is detected, determining a first pulse width based on a first correction setting at a point of the first failure of the divider circuit, and sending a control signal to a multiplexer coupled to a source of the input signal to thereby select an inverted form of the input signal for output to the correction circuit. The measurement device may determine the setting of the correction circuit at which the divider circuit fails by further sending control signals to the correction circuit to cycle through the one or more correction settings of the correction circuit until a second failure of the divider circuit is detected, determining a second pulse width based on a second correction setting at a point of the second failure of the divider circuit, and determining a duty cycle of the signal based on a relationship of the first pulse width and the second pulse width.

The measurement device may calculate the duty cycle of the input signal by calculating the duty cycle using the following equation:

$$DC=\frac{1}{2}-[(i_{path2}*(\text{delta})-i_{path1}*(\text{delta}))]/2T]$$

where DC is the duty cycle, $i_{path1}$ is an index of the first correction setting index, $i_{path2}$ is an index of the second correction setting, delta is a minimum correction amount of the correction circuit, and T is a period of the input signal.

The measurement device may determine a setting of the correction circuit at which the divider circuit fails by comparing an output of the divider circuit to the input signal, determining if the output of the divider circuit is a divided-down equivalent of the input signal based on the comparison, and determining that the divider circuit has failed if the output of the divider circuit is not a divided-down equivalent of the input signal. The measurement device may determine if the output of the divider circuit is a divided-down equivalent of the input signal based on the comparison by determining, based on the comparison, if there is a fixed phase relationship between the output of the divider circuit and the input signal such that the output of the divider circuit is synchronous with the input signal.

In other illustrative embodiments, a computer program product comprising a computer recordable medium having a computer readable program recorded thereon is provided. The computer readable program, when executed on a computing device, causes the computing device to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide an apparatus and methodology for determining the absolute duty cycle of an input signal. While the disclosed apparatus is especially useful for measurements in the Gigahertz range, i.e. approximately 1 GHz and above, it may also measure the duty cycle of lower frequency digital signals.

In the illustrative embodiments, the disclosed apparatus and methodology employ characteristics of a failed divider circuit, at the frequency where the divider circuit fails, to determine the duty cycle of an input signal, such as a clock signal. While the illustrative embodiments will be described with reference to determining the duty cycle of a clock signal output of a phase locked loop (PLL), it should be appreciated that this is only exemplary and is not intended to state or imply any limitation with regard to the types of signals or signal sources upon which the mechanisms of the illustrative embodiments may be applied. To the contrary, the mechanisms of the illustrative embodiments may be applied to any signal from any signal source so as to determine the duty cycle of that signal.

With the illustrative embodiments, the method and apparatus employ a duty cycle correction (DCC) circuit that adjusts the duty cycle of an input signal in a linear fashion, and a divider coupled to the DCC circuit. The divider is comprised of one or more flip-flops which have a built-in setup and hold time requirement. Thus, when the input signal pulse, e.g., clock pulse, violates the setup/hold time of the latches, the divider fails. The point at which this failure occurs provides information about the duty cycle of the input signal pulse which can be extracted by the mechanisms of the illustrative embodiments.

Figure 1:
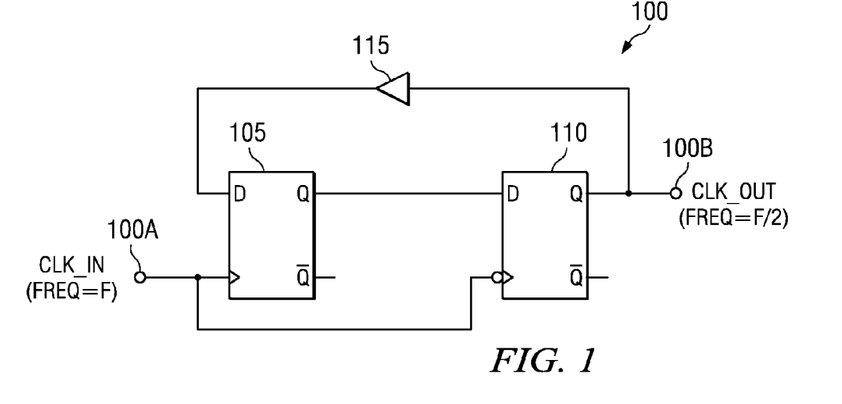
FIG. 1 is an exemplary diagram illustrating a divider circuit that a duty cycle measurement (DCM) apparatus according to the illustrative embodiments may employ.

FIG. 1 shows a representative divider circuit 100, which may be coupled to a DCC circuit in accordance with the illustrative embodiments as discussed hereafter. The divider circuit 100 includes an input 100A and an output 100B. Divider circuit 100 receives a digital signal exhibiting a predetermined frequency at its input 100A and provides a divided-down version of that digital signal at output 100B. Divider circuit 100 includes latches 105 and 110. The clock input of latch 105 couples to divider input 100A to receive a clock signal, CLK_IN, exhibiting a frequency F. The clock input of latch 105 couples to the clock input of latch 110 such that each latch clock input receives the same CLK_IN signal. The Q output of latch 105 couples to the D input of latch 110. The Q output of latch 110 couples via inverter 115 to the D input of latch 105. The Q output of latch 110 also couples to output 100B of divider circuit 100.

In this configuration, divider circuit 100 provides an output signal, CLK_OUT, at divider output 100B that exhibits a frequency, F/2, namely one half the frequency of the CLK_IN signal at input 100A. Latches 105 and 110 have a setup and hold requirement, namely a predetermined amount of time that a clock pulse must remain on the clock input of a latch to enable the latching in of data at the latch's D input. If the CLK_IN signal that divider circuit 100 receives violates the setup and hold requirement, then divider circuit 100 fails. When divider circuit 100 fails, the CLK_OUT signal that divider circuit 100 produces is not equal to a divided down signal, but rather some other waveform. The illustrative embodiments utilize this point of failure of the divider as a way of determining what setting of the DCC circuit to use to calculate the duty cycle of the input signal, e.g., the input clock signal CLK_IN. Based on the setting of the DCC circuit, the high/low periods of a clock period may be identified and used to calculate the duty cycle of the input signal.

Figure 2:
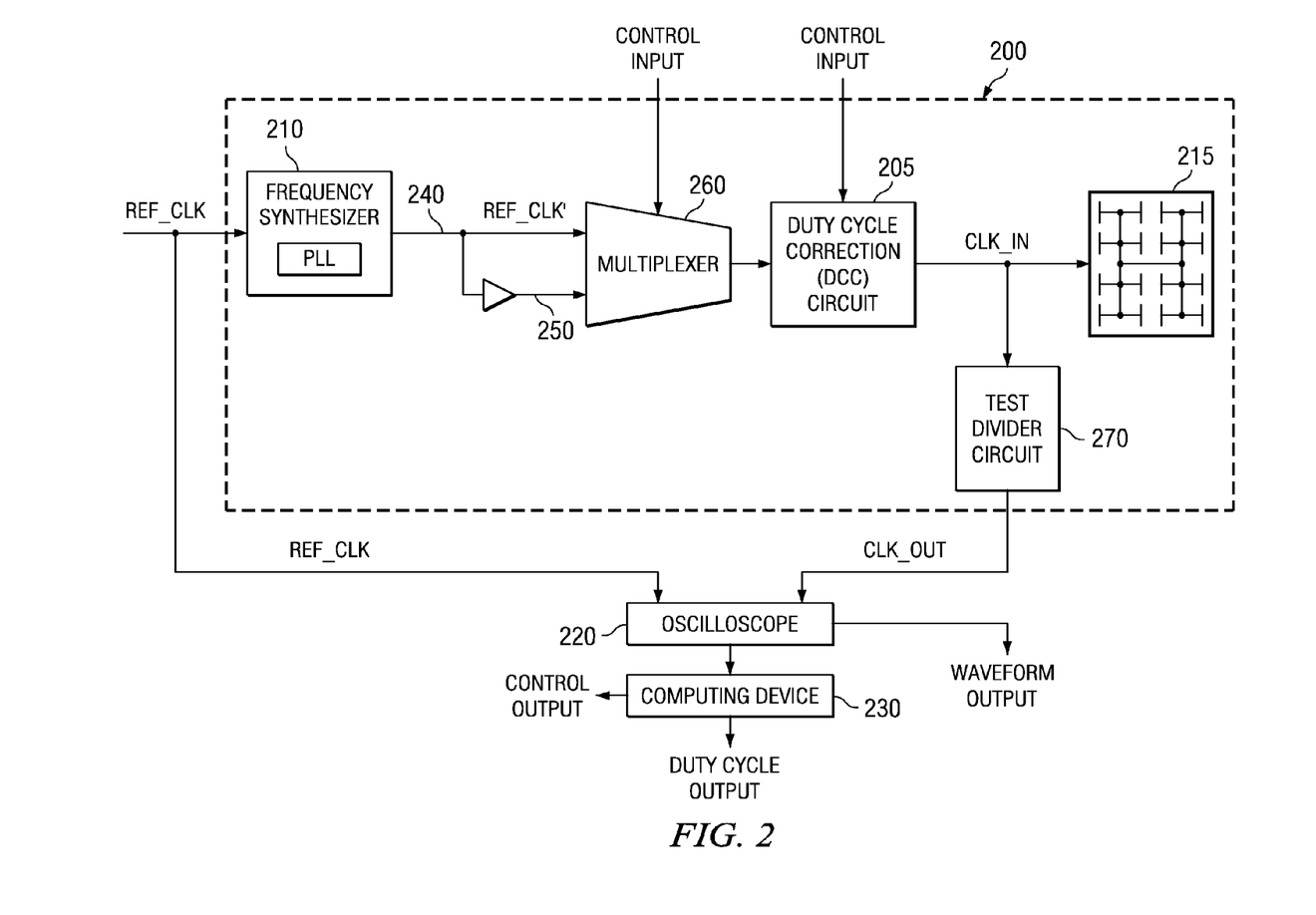
FIG. 2 is an exemplary diagram illustrating a DCM apparatus in accordance with one illustrative embodiment.

FIG. 2 shows one embodiment of a system 200 that measures the absolute duty cycle of an input clock signal. More particularly, system 200 includes a frequency synthesizer 210 that receives a reference clock signal, REF_CLK, from a reference clock source (not shown). Frequency synthesizer 210 may include, for example, a conventional phase locked loop (PLL), voltage controlled oscillator (VCO), and divider circuitry that enables frequency synthesizer 210 to generate an output signal, REF_CLK', at some multiple (M) times the frequency of the REF_CLK signal.

The output of the frequency synthesizer 210 is provided to a duty cycle correction (DCC) circuit 205 via two paths 240, 250 and multiplexer 260. A first of the two paths 240 provides the non-inverted output of the frequency synthesizer 210 while the second of the two paths 250 provides the inverted output of the frequency synthesizer 210 to the multiplexer 260. A select signal, in accordance with the mechanisms of the illustrative embodiments as described hereafter, selects whether to pass the non-inverted or the inverted output of the frequency synthesizer 210 to the DCC circuit 205.

The DCC circuit 205 is a variable duty cycle circuit that receives the non-inverted or inverted REF_CLK' signal from frequency synthesizer 210. In response to the inverted or non-inverted REF_CLK' signal, DCC circuit 205 supplies a CLK_IN signal at its output that is a function of the inverted or non-inverted REF_CLK' signal at its input. DCC circuit 205 may increase or decrease the duty cycle of the inverted or non-inverted REF_CLK' signal to generate the CLK_IN signal. Alternatively, DCC circuit 205 may leave the inverted or non-inverted REF_CLK' signal unaltered and pass the inverted or non-inverted REF_CLK' signal through to the output of DCC circuit 205 as the CLK_IN signal.

The output of the DCC circuit 205 is provided both to the clock grid 215 and a test divider circuit 270. The clock grid 215 distributes the corrected clock signal, namely an altered duty cycle clock signal, CLK_IN, to a number of functional blocks (not shown) that couple to clock grid 215. These functional blocks may include digital logic such as that found in processors, co-processors, other integrated circuit devices, as well as other electrical circuits.

The test divider circuit 270 may be, for example, one or more dividers such as that shown in FIG. 1. The test divider circuit 270 divides the CLK_IN signal by a predetermined amount and provides the divided CLK_IN signal, i.e. the CLK_OUT signal, to an oscilloscope 220, or other measurement equipment, which also receives as input the reference clock signal REF_CLK. In another illustrative embodiment, oscilloscope 220 may receive the REF_CLK' signal from the output of frequency synthesizer 210 instead of the reference clock signal REF_CLK.

Based on the reference clock signal REF_CLK, or the REF_CLK' signal, and the CLK_IN signal, it can be determined, such as by computing device 230, whether the CLK_IN signal is equal to a divided down REF_CLK, i.e. is an equivalent signal waveform to the REF_CLK or REF_CLK' signal waveform at a lower frequency, or some other waveform. If the CLK_IN is equal to some other waveform, then the test divider circuit 270 is determined by the computing device 230 to have failed and thus, the setting of the DCC circuit 205 may be used to determine the absolute duty cycle of the REF_CLK signal, as discussed hereafter. It should be appreciated that while an oscilloscope 220 is used in depicted example, other measurement equipment may be used, without departing from the spirit and scope of the illustrative embodiments, to compare the output of the test divider circuit 270 to a reference signal, e.g., REF_CLK or REF_CLK', to determine if the test divider circuit 270 has failed.

In one illustrative embodiment, the DCC circuit 205 is programmable so as to achieve different duty cycle corrections in accordance with the possible settings of the DCC circuit 205, thereby providing the variable duty cycle. The illustrative embodiments permit the DCC circuit 205 to cycle through all of the possible settings for the DCC circuit 205, under control of the computing device 230, until it is determined, by use of the oscilloscope 220 and the computing device 230, that the test divider circuit 270 has failed. The computing device 230 then uses this point of failure to calculate the duty cycle of the REF_CLK signal. The computing device 230 may generate an output indicative of the duty cycle of the REF_CLK signal which may be output, via an output device, to a user or to a verification system for verifying the operation of an integrated circuit device in which the duty cycle measurement circuit is implemented, for example. Moreover, it should be appreciated that the oscilloscope 220, or other measurement equipment, may provide an output of the waveforms of the output from the test divider circuit 270 and the input signal REF_CLK for use in performing a comparison of the waveforms.

The computing device 230, in addition to providing control signals to the DCC circuit 205, also provides control signals to the multiplexer 260 to select which path 240 or 250 to use for causing the test divider circuit 270 to fail. Each path is individually selected and the DCC circuit 205 is allowed to cycle through its settings until the test divider circuit 270 fails for each path 240 and 250. This gives two pulse widths from which the time duration that the output of the frequency synthesizer 210 is at a high state and a low state may be determined. From this information, the duty cycle of the REF_CLK signal may be calculated.

Figure 3A:
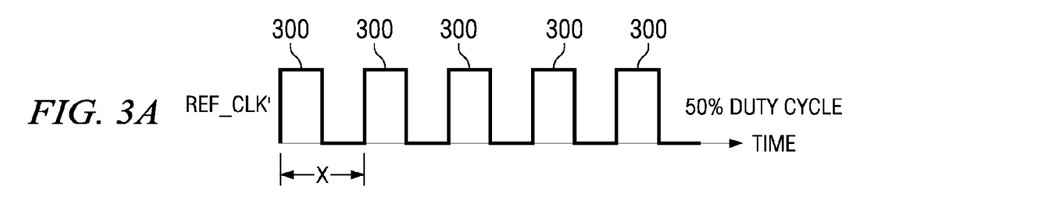
FIGS. 3A-3D are exemplary diagrams illustrating respective duty cycles as modified by a variable duty cycle circuit in accordance with one illustrative embodiment.
Figure 3B:
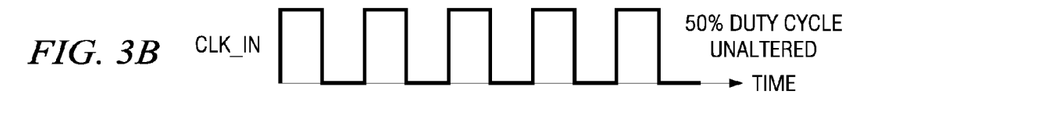

FIG. 3A shows a representative 50% duty cycle pulse signal, namely a clock signal REF_CLK' that DCC circuit 205 may receive at its input. This pulse signal includes multiple pulses 300 that correspond to logic highs. A logic low follows each pulse 300 or logic high as shown. The pulse signal exhibits a period, T, namely the time between the beginning of one pulse 300 and the following pulse 300. The pulse signal of FIG. 3A exhibits a logic high for 50% of each pulse period and thus this pulse signal exhibits a 50% duty cycle. When DCC circuit 205 leaves the duty cycle of the REF_CLK signal unaltered, then the CLK_IN signal at the output of DCC circuit 205 also exhibits a 50% duty cycle, such as shown in FIG. 3B.

Figure 3C:
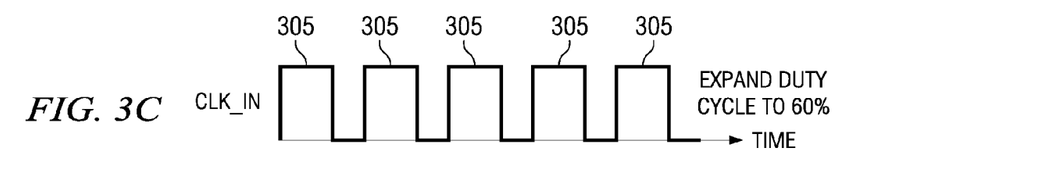
Figure 3D:
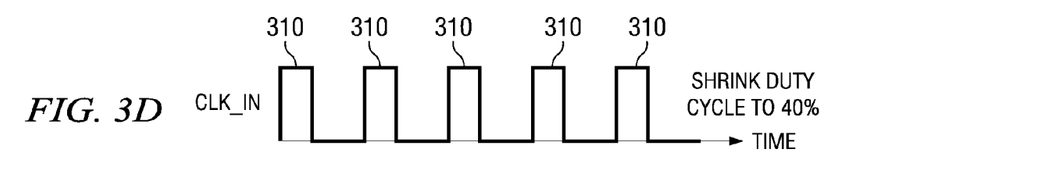

If DCC circuit 205 increases the duty cycle of the REF_CLK' signal that it receives, then the pulses 305 of the CLK_IN signal at the output of the DCC circuit 205 exhibit a longer duration than the corresponding pulses 300 at the DCC circuit 205 input. For example, the CLK_IN pulses 305 of FIG. 3C exhibit an expanded duty cycle of 60%. However, If DCC circuit 205 decreases the duty cycle of the REF_CLK' signal that it receives, then the pulses 310 of the CLK_IN signal at the output of the DCC circuit 205 exhibit a shorter duration than the corresponding pulses 300 at the DCC circuit 205 input. In this instance, DCC circuit 205 effectively shrinks the duty cycle of digital pulses it receives. For example, the CLK_IN pulses 310 of FIG. 3D exhibit a reduced duty cycle of 40%.

DCC circuit 205 may thus either expand or shrink the pulse width of pulses 300 that it receives. In one embodiment, the smallest correction to the pulse width that DCC circuit 205 can provide is (delta) picoseconds (Ps), namely the incremental duty cycle correction unit (delta). A correction index "i" defines the number of incremental duty cycle correction units (delta) that DCC circuit 205 will apply to a particular digital signal it receives. That is, with a correction index "i", the DCC circuit provides pulse width change or correction equal to i*(delta) picoseconds. The illustrative embodiments enable the determination of absolute duty cycle of an input signal using the incremental duty cycle correction units i*(delta) for each correction index "i" by using observations with respect to when test divider circuit 270 fails as explained in more detail below.

Returning to FIG. 2, in the depicted example, an internal voltage controlled oscillator (VCO) divider in frequency synthesizer 210 exhibits a setting of 2, such that frequency synthesizer 210 generates a 50% duty cycle signal, REF_CLK', at its output. Thus, the input of DCC circuit 205 receives a 50% duty cycle clock signal in this instance. In response, DCC circuit 205 adjusts the pulse waveform of the 50% duty cycle signal by a predetermined amount of time to generate the CLK_IN signal at the output of DCC circuit 205. Test divider circuit 270 receives this CLK_IN signal from DCC circuit 205 and attempts to divide the CLK_IN signal by a predetermined divisor or factor. In this particular example, the divisor is 2 while other divisor values may also be satisfactory depending upon the particular application.

Figure 4A:
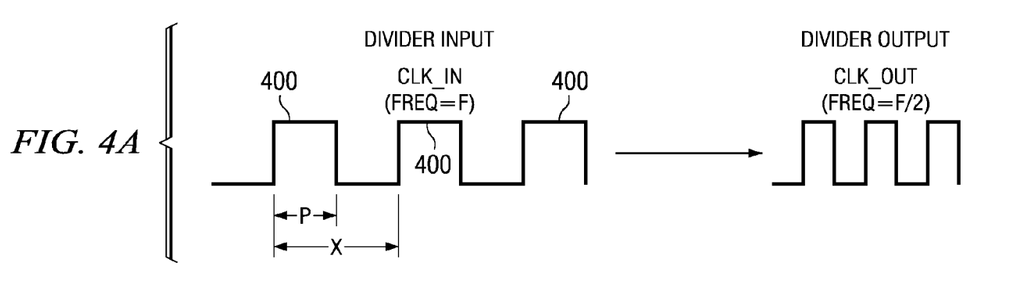
FIGS. 4A-4C are exemplary diagrams illustrating divider input and divider output signals under different operating conditions in accordance with one illustrative embodiment.

FIG. 4A shows the CLK_IN signal prior to divider action. FIG. 4A also shows the CLK_OUT signal after divider action, namely the divided-down version of the clock signal. In this particular example, test divider circuit 270 successfully divided the CLK_IN signal to form the CLK_OUT signal as seen by inspection of the CLK_OUT waveform in FIG. 4A. When test divider circuit 270 successfully conducts its division operation, the resultant CLK_OUT waveform is in synchronization with the CLK_IN signal at the input of the divider and is also in synchronization with the reference clock signal, REF_CLK. In this case where test divider circuit 270 is successful, the duration P of pulse 400 is not so long or short as to cause the test divider circuit 270 to fail.

However, at some frequencies the duration P of pulse 400 becomes so long or short that the pulse waveform violates the setup and hold threshold time, $T_{S/H}$, of test divider circuit 270. In response, test divider circuit 270 fails to divide.

Figure 4B:
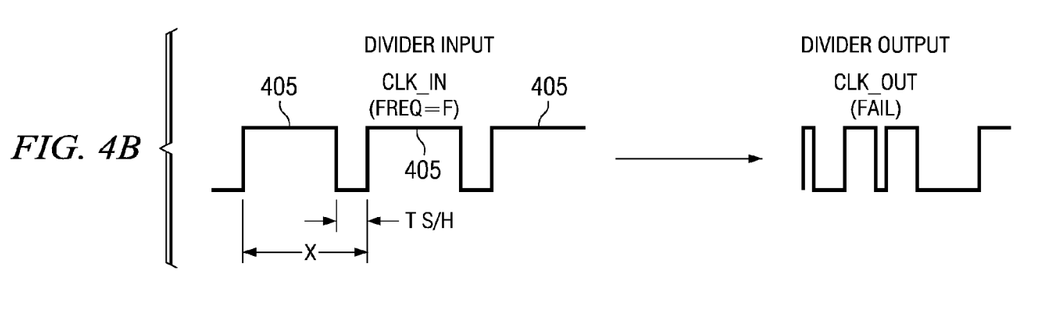

For example, as seen in FIG. 4B, when the pulses 405 become so long in duration that the time between pulses 405 is equal to or less than $T_{S/H}$, then test divider circuit 270 fails. In other words, the resultant output signal of test divider circuit 270, namely CLK_OUT, is not a divided down version of CLKN_IN, but rather is a corrupt version thereof. The lack of synchronism between the CLK_OUT signal and the REF_CLK signal, as may be determined by use of the oscilloscope 220 and the computing device 230, provides an indicator that test divider circuit 270 failed for this particular CLK_IN waveform.

Figure 4C:
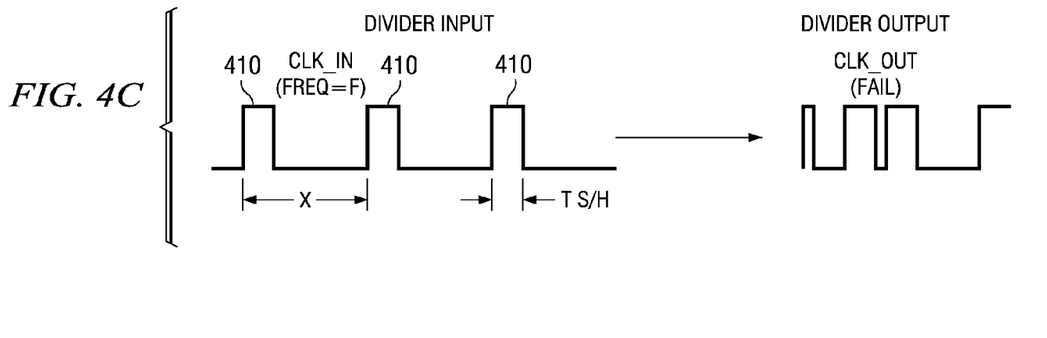

In a similar manner, at some frequencies the duration P of pulse 400 becomes so short that it violates the setup and hold threshold time, $T_{S/H}$, of test divider circuit 270. In response, test divider circuit 270 fails to divide. For example, as seen in FIG. 4C, when the pulses 410 become equal to or less than $T_{S/H}$ in duration, then test divider circuit 270 fails. In other words, the resultant output signal of test divider circuit 270, namely CLK_OUT, is not a divided down version of CLK_IN, but rather is a corrupt version thereof. Again, the lack of synchronism between the CLK_OUT signal and the REF_CLK signal provides an indicator that test divider circuit 270 failed for this particular CLK_IN waveform.

A user, or the computing device 230, may observe the output of the oscilloscope 220 to determine the $F_{MAX}$ frequency for each index setting "i" of the DCC circuit 205. For a particular index "i", DCC circuit 205 sends a CLK_IN signal exhibiting a duty cycle correction of i*(delta) to test divider circuit 270 as an input signal. The width of the CLK_IN pulse is thus the original REF_CLK' pulse width plus i*(delta). To observe the test divider circuit 270 at frequencies below and at the point of failure, the oscilloscope 220 receives the divider output signal, CLK_OUT, and triggers off the reference clock signal, REF_CLK. As seen in FIG. 2, the oscilloscope 220 receives both the divided down CLK_OUT signal and the REF_CLK signal, or REF_CLK' signal in an alternative embodiment, on which the oscilloscope 220 triggers. If the test divider circuit 270 did not yet fail, and the PLL in frequency synthesizer 210 is currently locked, then the reference clock, REF_CLK, and the divided down CLK_OUT signal from test divider circuit 270 are synchronous with one another. When REF_CLK and CLK_OUT are synchronous with one another, an oscilloscope 220 user, or computing device 230, can readily determine this condition by observing a fixed phase relationship between the two signals on the oscilloscope 220. However, when test divider circuit 270 fails, such as when the CLK_IN signal exceeds $F_{MAX}$ for a particular index i, REF_CLK and CLK_OUT are no longer synchronous with a fixed phase relationship there-between. Rather, when test divider circuit 270 fails, the test divider circuit 270 output exhibits a free running characteristic.

As mentioned above, the illustrative embodiments take advantage of the programmability of the DCC circuit 205, the failure characteristics of the test divider circuit 270, and the path selectability provided by the multiplexer 260 to generate two pulse width values, one for each path, which may then be used to calculate the absolute duty cycle of the input signal, e.g., REF_CLK in FIG. 2. In operation, the mechanisms of the illustrative embodiments first select the non-inverted path 240 from a signal source, e.g., frequency synthesizer 210. Such selection may be made by the computing device 230, or other control mechanism, sending a control signal to the multiplexer 260 to select the input from non-inverted path 240 for output to the DCC circuit 205, for example.

The various DCC circuit 205 setting indices i are cycled through until the test divider circuit 270 is determined to have failed. The computing device 230, or other control mechanism, may provide control signals to the DCC circuit 205 to thereby cause the DCC circuit 205 to cycle through the various indices i. The resulting output of the DCC circuit 205 is provided to the test divider circuit 270 which attempts to generate a divided down version of the input signal, e.g., REF_CLK. The result is provided to an oscilloscope 220 which may be monitored by a user or computing device 230 to determine if the test divider circuit 270 fails, as discussed above. A first minimum pulse width at which the divider fails is then determined based on the index value i of the DCC circuit at the time of the failure.

Next, the inverted path 250 from the signal source, e.g., frequency synthesizer 210, is selected and the various DCC circuit 205 setting indices i are cycled through again until the test divider circuit 270 fails. A second minimum pulse width at which the test divider circuit 270 fails is then determined based on the index value i of the DCC circuit 205 at the time of this second failure. The duty cycle is then calculated based on a difference of the first and second minimum pulse width values.

For example, if the period of a clock signal output by a signal source, e.g., a PLL of frequency synthesizer 210, is $T_{PLL}$, the time duration of the high state of the clock from the PLL of the frequency synthesizer 210 is $T_{high}$, and the time duration of the low state of the clock from the PLL of frequency synthesizer 210 is $T_{low}$, then:

$$T_{PLL}=T_{high}+T_{low} \quad (1)$$

Then the duty cycle of the frequency synthesizer 210 clock ($DC_{PLL}$) is:

$$DC_{PLL}=T_{high}/T_{PLL} \quad (2)$$

For a given correction bit setting i of the DCC circuit 205, the pulse width of the clock signal at the output of the DCC circuit 205 (referred to as pulse width P) may then be determined as:

$$P = T_{high, low} - i*(\text{delta}) \quad (3)$$

where if $P \leq P_{min}$, the test divider circuit 270 fails and this failure can be observed with an oscilloscope 220. $T_{high,low}$ is determined based on which path is selected, i.e. the non-inverted path 240 or the inverted path 250 from the output of the frequency synthesizer 210 to the DCC circuit 205. For example, if the non-inverted path 240 is selected, then $P = T_{high} - i*(\text{delta})$. If the inverted path 250 is selected, then $P = T_{low} - i*(\text{delta})$.

As discussed above, the technique of the illustrative embodiments is to first select the non-inverted path from the frequency synthesizer 210 and then sweep through all of the various DCC circuit 205 setting indices i until the test divider circuit 270 coupled to the output of the DCC circuit 205 fails. The index i at which the test divider circuit 270 fails, for a case in which the non-inverted path 240 is selected, may be referred to as $i_{path1}$ and thus, $$P_{min} = T_{high} - i_{path1}*(\text{delta}) \quad (4)$$

Next, the inverted path 250 is selected and the DCC circuit 205 setting indices i are again swept until the test divider circuit 270 fails. The index i at which the test divider circuit 270 fails in this case is referred to as $i_{path2}$ and, because of the inversion present in the inverted path 250, the minimum pulse width is:

$$P_{min} = T_{low} - i_{path2}*(\text{delta}) \quad (5)$$

Subtracting equation (4) from (5), one obtains:

$$0 = (T_{low} - i_{path2}*(\text{delta})) - (T_{high} - i_{path1}*(\text{delta})) \quad (6)$$

which is further simplified to:

$$T_{low} - i_{path2}*(\text{delta}) = T_{high} - i_{path1}*(\text{delta}) \quad (7)$$

then, combining equation (1) and equation (7), one obtains:

$$T_{high} = [T_{PLL} - (i_{path2}*(\text{delta}) - i_{path1}*(\text{delta}))]/2 \quad (8)$$

All parameters on the right hand side of equation (8) are known and thus, one can extract $T_{high}$ and subsequently the duty cycle of the frequency synthesizer 210 clock using equation (2) above. That is:

$$DC_{PLL} = \frac{1}{2}[-(i_{path2}*(\text{delta}) - i_{path1}*(\text{delta}))/2T_{PLL}] \quad (9)$$

Because of the discrete nature of the DCC circuit 205 adjustments, there is a resolution limit to the duty cycle extraction or calculation. This discreteness is a result of the fact that the minimum duty cycle adjustment is limited to a maximum setting allowed by the configuration of the DCC circuit 205. As a result, the extracted $T_{high}$ value has an uncertainty of $+/-\frac{1}{2}$ of the smallest DCC circuit 205 adjustment value, e.g., if the adjustment value is 1 ps, then the uncertainty is +/−0.5 ps. Including this uncertainty in equation (9) above, the duty cycle extraction or calculation uncertainty is given by:

$$+/-(\text{delta})/(2*T_{PLL}) \quad (10)$$

Therefore, the resolution improves for smaller DCC circuit increments and larger clock periods ($T_{PLL}$). For example, for a DCC circuit increment of 5 ps, and a 4 GHz clock ($T_{PLL}$=0.25 ns), the $DC_{PLL}$ resolution will be 1%.

Thus, the illustrative embodiments provide an apparatus and method for sub-pico second resolution characterization of duty cycle of high-speed input signals, e.g., clock signals. The apparatus and method require very little additional hardware, i.e. only a multiplexer and a test divider circuit, is fast, cheap, and non-destructive. The mechanisms of the illustrative embodiments may be easily adopted for testing in mass manufacturing environments.

It should be noted that while the above illustrative embodiments make use of two paths, i.e. the non-inverted path 240 and the inverted path 250, to generate two pulse width values, the illustrative embodiments are not limited to such. Rather, if the DCC circuit 205 can provide monotonic and linear correction in both positive and negative directions, then the inverted path 250 in FIG. 2 may be eliminated altogether. However, this will require the implicit assumption that the flip-flops in the test divider circuit 270 fail identically both when the input clock pulse is too small and when the input clock pulse is too wide.

Moreover, while the illustrative embodiments are described above with regard to using an oscilloscope 220 to characterize the output of the test divider circuit 270 in relation to the input signal, e.g., REF_CLK or REF_CLK', the illustrative embodiments are not limited to such. Rather, any mechanism capable of providing a comparison of these signals may be used without departing from the spirit and scope of the present invention. For example, the signals may be provided as input to the computing device 230 directly which may then compare the signals to determine if the test divider circuit 270 has failed or not.

In addition to the above, it should be noted that the illustrative embodiments are described in terms of a single reference clock signal input being provided to the duty cycle characterization circuitry. However, in another illustrative embodiment, the duty cycle characterization circuitry of the illustrative embodiments may be used to characterize the duty cycle of any of a plurality of input signals, e.g., clock signals.

Figure 5:
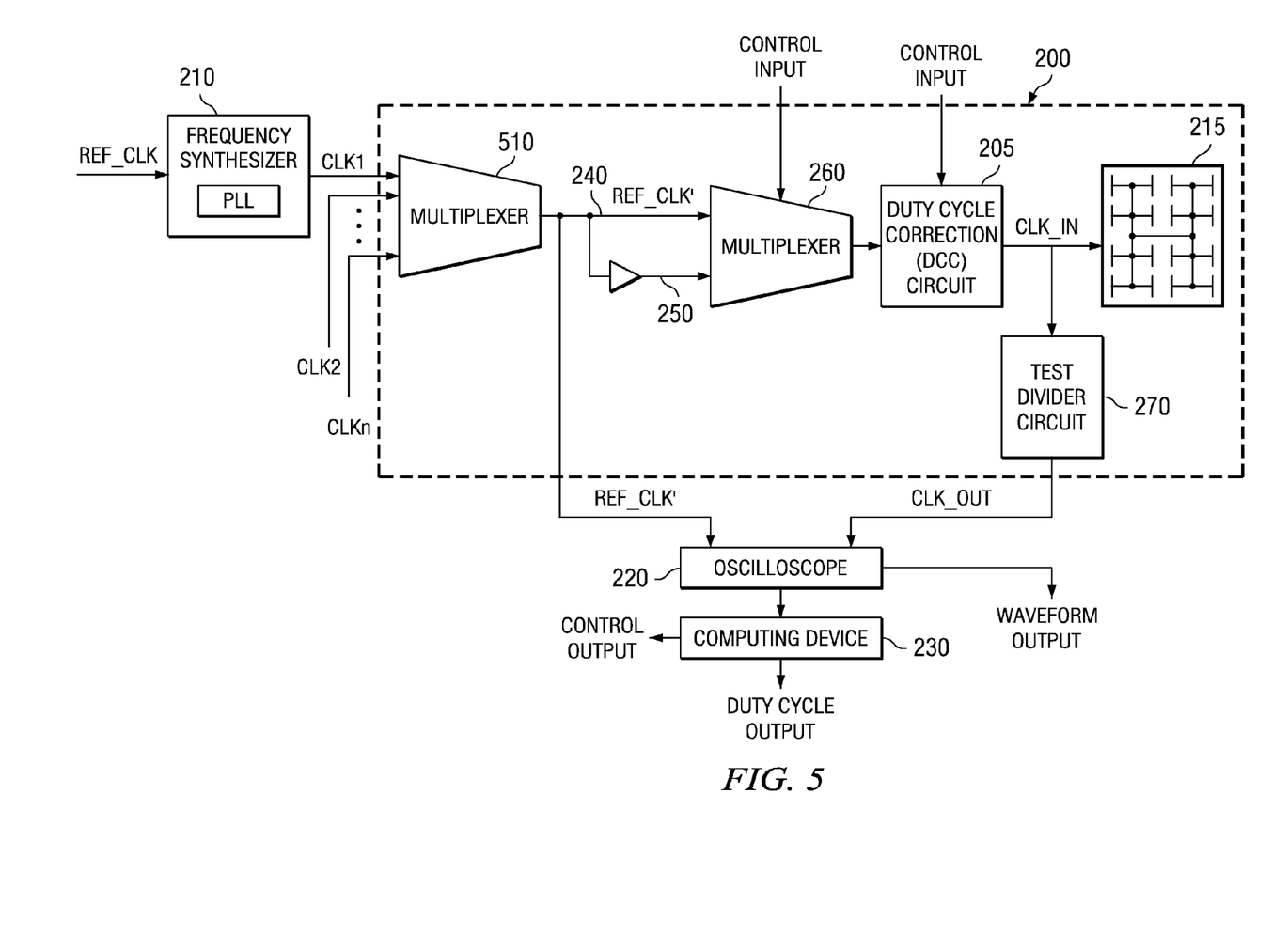
FIG. 5 is an exemplary diagram illustrating a duty cycle characterization circuit in which a plurality of clock signals may be characterized in accordance with one illustrative embodiment.

FIG. 5 is an exemplary diagram illustrating a duty cycle characterization circuit in which a plurality of clock signals may be characterized in accordance with one illustrative embodiment. As shown in FIG. 5, the circuitry is essentially the same as that of FIG. 2 with the addition of a multiplexer 510 between the frequency synthesizer 210 and the multiplexer 260. The multiplexer 510 selects one of a plurality of input signals to be provided as an output along non-inverted path 240 and inverted path 250 to the multiplexer 260. The multiplexer 510 may receive control signals, such as from computing device 230, to control which input signal is output for characterization by the duty cycle characterization circuitry.

Figure 6:
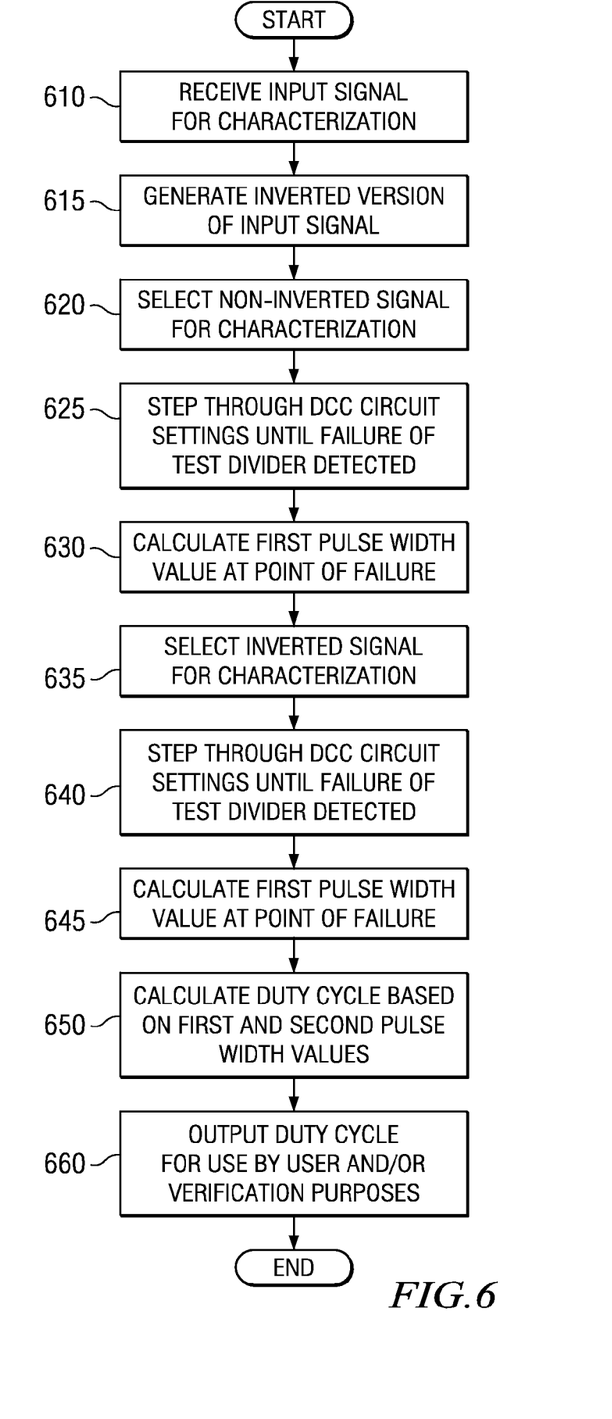
FIG. 6 is a flowchart outlining an exemplary operation for characterizing the duty cycle of an input signal in accordance with one illustrative embodiment.

FIG. 6 is a flowchart outlining an exemplary operation for characterizing the duty cycle of an input signal in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

Furthermore, the flowchart is provided to demonstrate the operations performed within the illustrative embodiments. The flowchart is not meant to state or imply limitations with regard to the specific operations or, more particularly, the order of the operations. The operations of the flowchart may be modified to suit a particular implementation without departing from the spirit and scope of the present invention.

As shown in FIG. 6, the operation starts with receiving an input signal for characterization by the duty cycle characterization circuitry (step 610). An inverted version of the input signal is generated (step 615). The non-inverted input signal is selected for characterization and is provided to a duty cycle correction circuit (step 620). The duty cycle correction circuit is stepped through its possible index settings until a corresponding test divider circuit is determined to have failed (step 625). A first pulse width value at the point of failure of the test divider circuit is calculated based on the setting of the DCC circuit (step 630).

The inverted input signal is selected for characterization and is provided to the duty cycle correction circuit (step 635). The duty cycle correction circuit is again stepped through its possible index settings until a corresponding test divider circuit is determined to have failed (step 640). A first pulse width value at the point of failure of the test divider circuit is calculated based on the setting of the DCC circuit (step 645).

The first and second pulse width values are then used to calculate a duty cycle for the input signal (step 650). The duty cycle may then be output for use by a user, or used to perform other testing or verification of the integrated circuit device in which the mechanisms of the illustrative embodiments are implemented (step 660). The operation then terminates.

Figure 7:
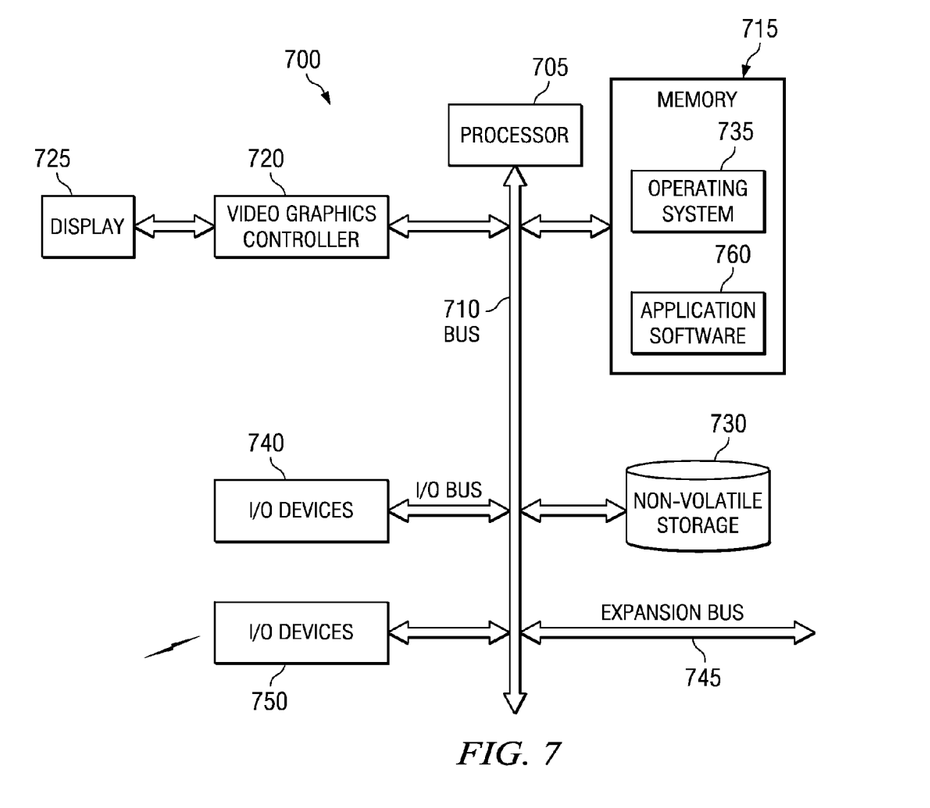
FIG. 7 is an exemplary diagram of an information handling system (IHS) in which the exemplary aspects of the illustrative embodiments may be implemented.

FIG. 7 shows an information handling system (IHS) 700 that employs integrated circuit 200 of FIG. 2 or 500 of FIG. 5 as a processor 705 for the IHS. In this example, processor 705 includes the functional blocks (not shown) typically associated with a processor such as an instruction decoder, execution units, load/store units as well as other functional units. The reference clock, oscilloscope 220 and computing device/controller 230 (not shown in FIG. 7) may be coupled to the integrated circuit processor 705 to perform the duty cycle measurements described above.

IHS 700 further includes a bus 710 that couples processor 705 to system memory 715 and video graphics controller 720. A display 725 couples to video graphics controller 720. Non-volatile storage 730, such as a hard disk drive, CD drive, DVD drive, or other non-volatile storage couples to bus 710 to provide IHS 700 with permanent storage of information. An operating system 735 loads in memory 715 to govern the operation of IHS 700, such as running of application software 760. I/O devices 740, such as a keyboard and a mouse pointing device, are coupled to bus 710. One or more expansion busses 745, such as USB, IEEE 1394 bus, ATA, SATA, PCI, PCIE and other busses, are also coupled to bus 710 to facilitate the connection of peripherals and devices to IHS 700. A network adapter, which may be considered one of the I/O devices 750, may be coupled to bus 710 to enable IHS 700 to connect by wire or wireless link to a network and/or other information handling systems.

While FIG. 7 shows one IHS 700 that employs processor 705, the IHS 700 may take many other forms. For example, IHS 700 may take the form of a desktop, server, portable, laptop, notebook, or other form factor computer or data processing system. IHS 700 may take other form factors such as a gaming device, a personal digital assistant (PDA), a portable telephone device, a communication device or other devices that include a processor and memory. While IHS 700 of FIG. 7 is described as an information handling system, computing device/controller 230 of FIG. 2 is itself a form of information handling system.

It should be appreciated that the portions of the illustrative embodiments may take the form of an entirely hardware embodiment, an entirely software embodiment or an embodiment containing both hardware and software elements. In one exemplary embodiment, the mechanisms of the illustrative embodiments are implemented in hardware, such as in the duty cycle characterization circuitry described above, but with software control and computation of duty cycle via computing device/controller 230. The software may be provided, for example, in firmware, resident software, microcode, etc.

Furthermore, the portions of the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read-only memory (CD-ROM), compact disk—read/write (CD-R/W) and DVD.

Moreover, the circuitry as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly.

The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections).

In any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in an integrated circuit device, for determining a duty cycle of an input signal, comprising:
    receiving the input signal in a correction circuit which generates an output to a divider circuit coupled to the correction circuit based on the input signal;
    determining a setting of the correction circuit at which the divider circuit fails; and
    calculating a duty cycle of the input signal based on the setting of the correction circuit at which the divider circuit fails,
    wherein determining a setting of the correction circuit at which the divider circuit fails comprises:
        cycling through one or more of correction settings of the correction circuit until a first failure of the divider circuit is detected;
        determining a first pulse width based on a first correction setting at a point of the first failure of the divider circuit;
        generating an inverted form of the input signal;
        providing the inverted form of the input signal to the correction circuit;
        cycling through the one or more correction settings of the correction circuit until a second failure of the divider circuit is detected;
        determining a second pulse width based on a second correction setting at a point of the second failure of the divider circuit; and
        determining the duty cycle of the input signal based on a relationship of first pulse width and the second pulse width.

2. The method of claim 1, wherein calculating the duty cycle of the input signal comprises calculating the duty cycle using the following equation:

$$DC=[½-[(i_{path2}*(\text{delta})-i_{path1}*(\text{delta}))]/2T]$$

where DC is the duty cycle, $i_{path1}$ is an index of the first correction setting index, $i_{path2}$ is an index of the second correction setting, delta is a minimum correction amount of the correction circuit, and T is a period of the input signal.

3. The method of claim 1, further comprising:
    providing an output indicative of the calculated duty cycle of the input signal.

4. The method of claim 1, wherein the input signal is received from a frequency synthesizer having a phase locked loop.

5. The method of claim 1, wherein the input signal is a clock signal and wherein the method further comprises:
    selecting the clock signal from a plurality of clock signals of the integrated circuit device.

6. The method of claim 1, wherein determining a setting of the correction circuit at which the divider circuit fails comprises:
    comparing an output of the divider circuit to the input signal;
    determining if the output of the divider circuit is a divided-down equivalent of the input signal based on the comparison; and
    determining that the divider circuit has failed if the output of the divider circuit is not a divided-down equivalent of the input signal.

7. The method of claim 6, wherein determining if the output of the divider circuit is a divided-down equivalent of the input signal based on the comparison comprises:
    determining, based on the comparison, if there is a fixed phase relationship between the output of the divider circuit and the input signal such that the output of the divider circuit is synchronous with the input signal.

8. An apparatus for determining a duty cycle of an input signal, comprising:
    a correction circuit;
    a divider circuit coupled to the correction circuit; and
    a measurement device coupled to the divider circuit, wherein:
    the correction circuit receives the input signal and generates an output signal to the divider circuit based on the input signal,
    the measurement device determines a setting of the correction circuit at which the divider circuit fails,
    the measurement device calculates a duty cycle of the input signal based on the setting of the correction circuit at which the divider circuit fails, and
    the measurement device determines a setting of the correction circuit at which the divider circuit fails by:
        sending control signals to the correction circuit to cycle through one or more correction settings of the correction circuit until a first failure of the divider circuit is detected;
        determining a first pulse width based on a first correction setting at a point of the first failure of the divider circuit;
        sending a control signal to a multiplexer coupled to a source of the input signal to thereby select an inverted form of the input signal for output to the correction circuit;
        sending control signals to the correction circuit to cycle through the one or more correction settings of the correction circuit until a second failure of the divider circuit is detected;
        determining a second pulse width based on a second correction setting at a point of the second failure of the divider circuit; and
        determining the duty cycle of the input signal based on a relationship of the first pulse width and the second pulse width.

9. The apparatus of claim 8, wherein the measurement device calculates the duty cycle of the input signal by calculating the duty cycle using the following equation:

$$DC=½-[[(i_{path2}*(\text{delta})-i_{path1}*(\text{delta}))]/2T]$$

where DC is the duty cycle, $i_{path1}$ is an index of the first correction setting index, $i_{path2}$ is an index of the second correction setting, delta is a minimum correction amount of the correction circuit, and T is a period of the input signal.

10. The apparatus of claim 8, wherein the measurement device provides an output indicative of the calculated duty cycle of the input signal.

11. The apparatus of claim 8, wherein the input signal is received from a frequency synthesizer having a phase locked loop.

12. The apparatus of claim 8, wherein the input signal is a clock signal and wherein the correction circuit selects the clock signal from a plurality of clock signals of the integrated circuit device.

13. The apparatus of claim 8, wherein the measurement device determines a setting of the correction circuit at which the divider circuit fails by:
   comparing an output of the divider circuit to the input signal;
   determining if the output of the divider circuit is a divided-down equivalent of the input signal based on the comparison; and
   determining that the divider circuit has failed if the output of the divider circuit is not a divided-down equivalent of the input signal.

14. The apparatus of claim 13, wherein the measurement device determines if the output of the divider circuit is a divided-down equivalent of the input signal based on the comparison by:
   determining, based on the comparison, if there is a fixed phase relationship between the output of the divider circuit and the input signal such that the output of the divider circuit is synchronous with the input signal.

15. A computer program product comprising a non-transitory computer recordable medium having a computer readable program recorded thereon, wherein the computer readable program, when executed on a computing device, causes the computing device to:
   determine a setting of a correction circuit at which a divider circuit, coupled to the correction circuit, fails based on an input signal provided to the correction circuit; and
   calculate a duty cycle of the input signal based on the setting of the correction circuit at which the divider circuit fails, wherein the computer readable program causes the computing device to determine the setting of the correction circuit at which the divider circuit fails by:
      controlling the correction circuit to cycle through one or more correction settings of the correction circuit until a first failure of the divider circuit is detected;
      determining a first pulse width based on a first correction setting at a point of the first failure of the divider circuit;
      controlling a multiplexer coupled to a source of the input signal to thereby select an inverted form of the input signal for output to the correction circuit;
      controlling the correction circuit to cycle through the one or more correction settings of the correction circuit until a second failure of the divider circuit is detected;
      determining a second pulse width based on a second correction setting at a point of the second failure of the divider circuit; and
      determining the duty cycle of the joint signal based on a relationship of the first pulse width and the second pulse width.

16. The computer program product of claim 15, wherein the computer readable program causes the computing device to calculate the duty cycle of the input signal by calculating the duty cycle using the following equation:

$$DC = \frac{1}{2} - [[(i_{path2} * (drelta) - i_{path1} * (delta))]/2T]$$

where DC is the duty cycle, $i_{path1}$ is an index of the first correction setting index, $i_{path2}$ is an index of the second correction setting, delta is a minimum correction amount of the correction circuit, and T is a period of the input signal.

17. The computer program product of claim 15, wherein the computer readable program causes the computing device to determine a setting of the correction circuit at which the divider circuit fails by:
   comparing an output of the divider circuit to the input signal;
   determining if the output of the divider circuit is a divided-down equivalent of the input signal based on the comparison; and
   determining that the divider circuit has failed if the output of the divider circuit is not a divided-down equivalent of the input signal.

18. The computer program product of claim 15, wherein the computer readable program further causes the computing device to:
   provide an output indicative of the calculated duty cycle of the input signal.

19. The computer program product of claim 15, wherein the input signal is received from a frequency synthesizer having a phase locked loop.

20. The computer program product of claim 15, wherein the input signal is a clock signal and wherein the computer readable program further causes the computing device to:
   select the clock signal from a plurality of clock signals of the integrated circuit device.

* * * * *